United States Patent [19]

Mills et al.

[11] 3,913,213

[45] Oct. 21, 1975

[54] INTEGRATED CIRCUIT TRANSISTOR SWITCH

[75] Inventors: Thomas Gene Mills, Carson; Beethoven Corpus Valino, Los Angeles, both of Calif.

[73] Assignee: TRW Inc., Los Angeles, Calif.

[22] Filed: Aug. 2, 1974

[21] Appl. No.: 494,089

[52] U.S. Cl. .................... 29/577; 29/580; 357/46; 357/15

[51] Int. Cl.$^2$ .................... B01J 17/00

[58] Field of Search .......... 29/577, 580; 357/40, 46, 357/15, 39

[56] References Cited

UNITED STATES PATENTS

| | | | |
|---|---|---|---|
| 3,275,846 | 9/1966 | Bailey | 357/46 |
| 3,518,494 | 6/1970 | James | 29/577 |
| 3,736,477 | 5/1973 | Berger | 357/46 |
| 3,770,606 | 11/1973 | Lepselter | 357/15 |

*Primary Examiner*—W. Tupman

[57] ABSTRACT

An integrated circuit including a transistor with a diode shunted between the emitter and base to improve switching time. A method of forming a pn diffused junction or Schottky barrier diode in a monolithic integrated structure including a transistor or Darlington circuit so that the diode shunts the emitter base diode of the transistor, or in the case of the Darlington circuit, the input transistor, thereby improving the switching speed of the device.

9 Claims, 9 Drawing Figures

INTEGRATED CIRCUIT TRANSISTOR SWITCH

BACKGROUND OF THE INVENTION

1. Field of the Invention

This invention relates to transistor switching circuits and more particularly to means for improving the switching speed of transistors.

2. Prior Art

It is well known in the prior art that one limitation on the switching speed capability of a transistor, particularly a Darlington circuit or one handling high power, is caused by the phenomenon known as "storage time." When a transistor switch is in the on condition, the base region is possessed of a large number of minority carriers which must be dissipated before the transistor can resume the off condition. The time taken to sweep the minority carriers out of the base region is known as the "storage time" and can be the limiting factor in the operating speed of the switch.

Several techniques have been utilized in the prior art to reduce the storage time, including the use of a diode connected between the base and emitter of the transistor, polarized oppositely to the base emitter pn junction. When using discrete components, this solution has been found to be satisfactory, but until the present invention, it has not been practical to realize the circuit monolithically. Integrated circuits utilizing this technique have been forced to install a discrete diode connected to the desired points on the integrated circuit chip. Such a procedure is expensive and undesirable.

Accordingly, it is an object of the present invention to provide a monolithic circuit having a reversed diode connected across the emitter base junction of one of the transistors to enhance its switching speed.

It is another object of this invention to provide a fast switching integrated Darlington circuit.

SUMMARY OF THE INVENTION

The present invention is best described in connection with a Darlington pair transistor switch. As described above, the switching speed of such a circuit is enhanced by the inclusion of a reversed diode across the base emitter diode of the input transistor of the pair. If an attempt is made to realize such a circuit in monolithic form by utilizing prior art techniques, unsatisfactory operation will ensue because of conflicting doping requirements for regions which are preferably processed simultaneously. The emitter of the transistor is preferably doped to a carrier concentration of greater than $10^{20}$ carriers per cubic centimeter while the cathode of the diode (in the case of an npn transistor structure), which should be formed in the same diffusion step as the emitter, is preferably doped to less than $10^{17}$ carriers per cubic centimeter. Higher carrier concentration in the cathode of the diode results in tunneling and lower Zener breakdown voltage, or even ohmic junctions when Schottky barrier diodes are being used. Low carrier concentration in the transistor emitter results in insufficient carriers to assure desired transistor operation.

The apparent conflict is resolved in the present invention by forming both the emitter and diode cathode with a surface carrier concentration corresponding to the desired level in the emitter and then selectively etching or otherwise removing the surface of the diode cathode until material having the desired cathode concentration is exposed. Interconnection of the various circuit portions then proceeds in accordance with conventional techniques.

Figure 1:
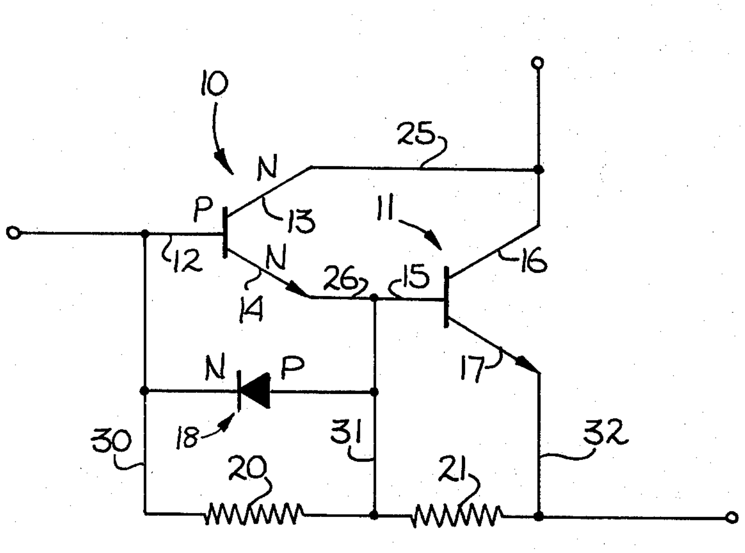
FIG. 1 is a schematic view of a prior art Darlington circuit to which has been added, a diode across the emitter and base of the first transistor.
Figure 2:
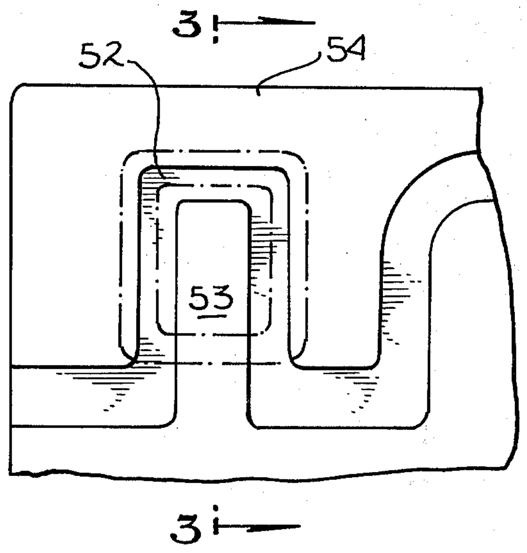
FIG. 2 is a plan view of a portion of a monolithic integrated circuit realization of the circuit of FIG. 1 taken in the vicinity of the diode.
Figure 3:
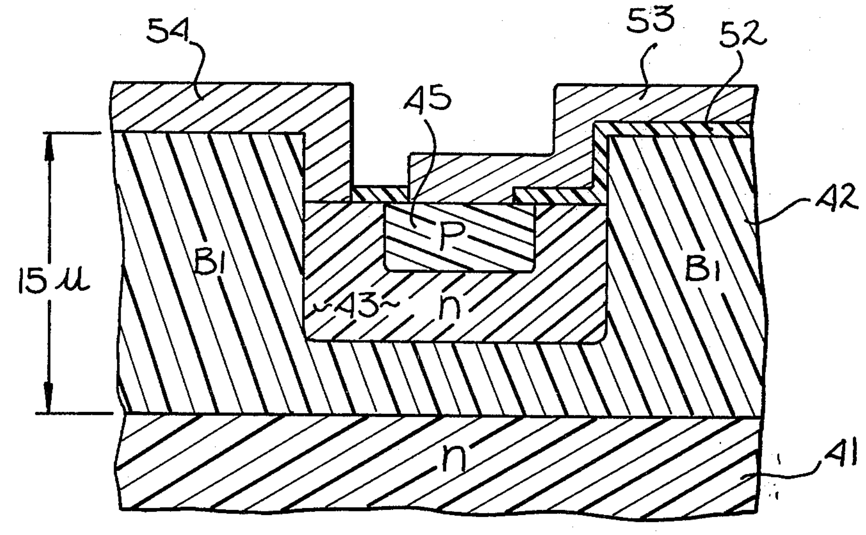
FIG. 3 is an enlarged cross section view of the integrated circuit of FIG. 2 taken along line 3—3 of FIG. 2.
Figure 5:
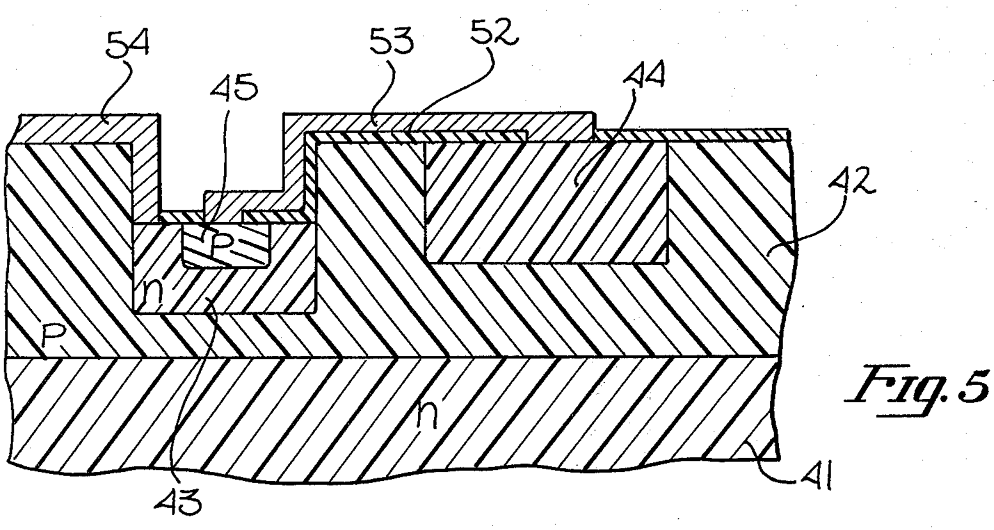
Figure 6:
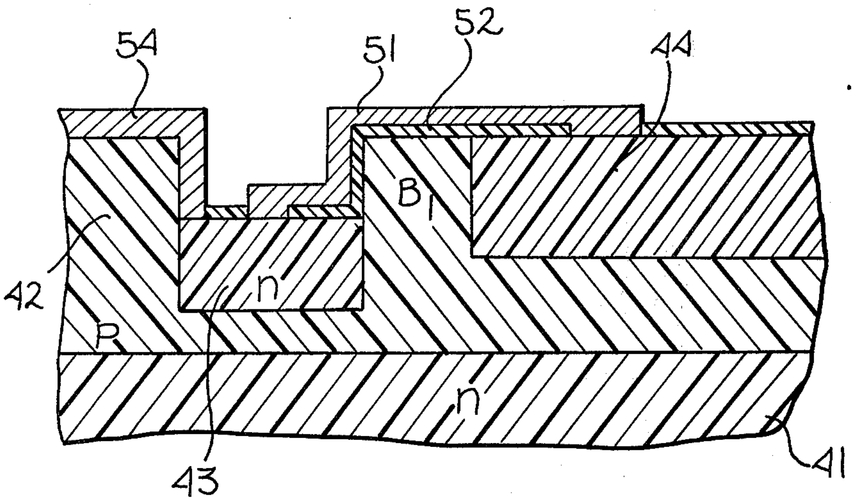

FIG. *4a* is an enlarged cross sectional view of a typical parent crystal which would typically be employed in the manufacture of the monolithic integrated circuit of FIGS. 2 and 3;

FIG. *4b* is a section view showing the crystal of FIG. *4a* during a subsequent manufacturing step in accordance with a presently preferred embodiment of this invention;

FIG. *4c* and *4d* are views similar to FIG. *4b* during further steps in the fabrication of the present invention integrated circuit FIG. 5 is an enlarged partial cross sectional view of a portion of monolithic integrated circuit having the schematic circuit of FIG. 1, in the vicinity of the diode; and FIG. 6 is an enlarged partial cross sectional view of an alternative embodiment of a monolithic integrated circuit similar to that of FIG. 5.

DESCRIPTION OF THE PREFERRED EMBODIMENTS

In FIG. 1, there is shown a typical Darlington circuit consisting of a first transistor 10, a second transistor 11 and two resistors 20 and 21, each of the transistors 10 and 11 respective are shown to be of the npn type. The first transistor 10 has a base 12, a collector 13 and an emitter 14, while the second transistor 11 has a base 15, collector 16 and emitter 17. The collector 13 and 16 of the two transistors are interconnected by lead 25, while the emitter 14 of transistor 10 is coupled by means of lead 26 to the base 15 of transistor 11. A first resistor 20 is connected between the base 12 and the emitter 14 of transistor 10 by means of leads 30 and 31 while a second resistor 21 is connected from the base 15 to the emitter 17 of the second transistor 11 by means of leads 31 and 32.

As alluded to above, in order to enhance the switching speed of the circuit of FIG. 1, a diode 18 is connected between the base 12 and emitter 14 of transistor 10. This circuit is old and well known and is in all respects satisfactory in discrete form. Prior art integrated circuits using the connection described, however, are inconvenient to fabricate for the reason that it has not been found practical to realize the diode and transistor required without elaborate isolation techniques or the use a hybrid circuit with a discrete diode. Consequently, in presently available units, a hybrid circuit is used despite the expense and inconvenience of having separate chips with attendant mounting and interwiring problems.

In accordance with the present invention a monolithic equivalent to the Darlington circuit of FIG. 1 can be fabricated without elaborate processing as will now be described. The description presented will concentrate on the realization of the diode and its interconnection with the transistors of the Darlington circuit since the other portions of the circuit are fabricated utilizing prior art techniques and processes, which are well known and understood by those skilled in the art. It should be understood that while for convenience the method is described in connection with a Darlington pair switch of the npn type, pnp types could be used and the method is applicable to other transistor switches and particularly those intended for relatively high power.

Figure 4A:
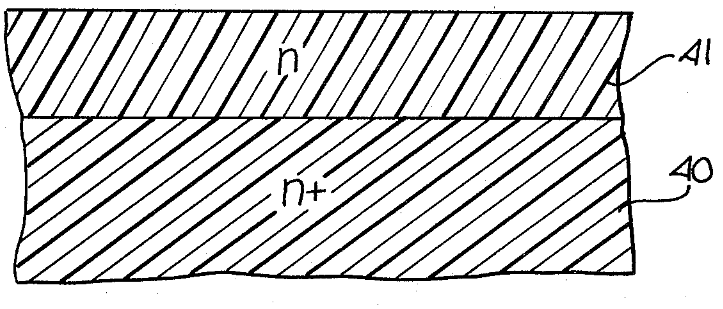
Figure 4B:
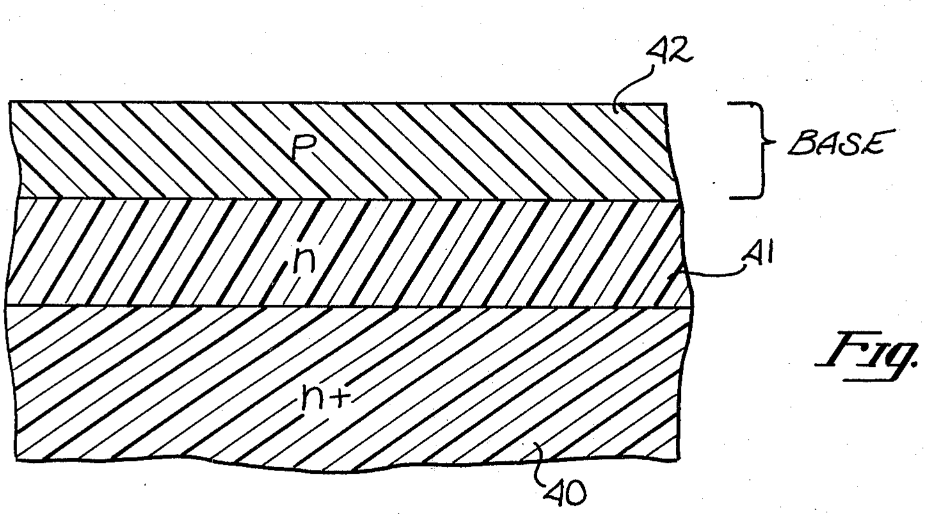
Figure 4C:
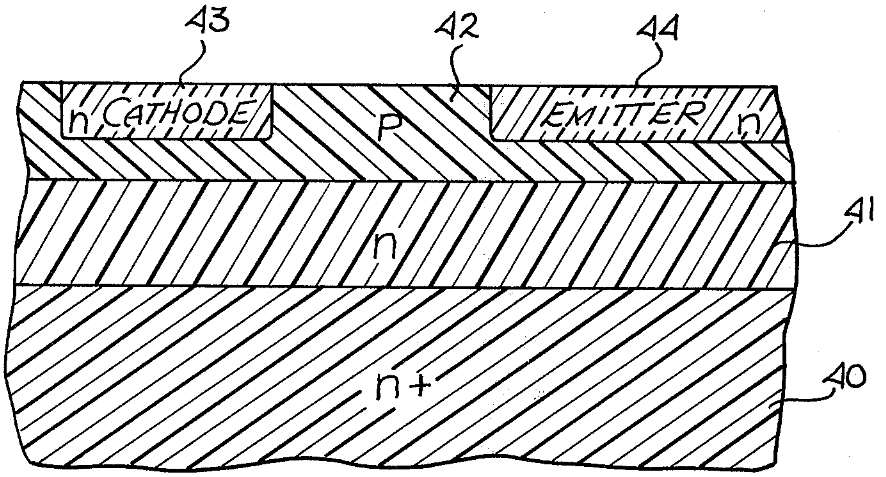

In FIG. 4*a* a small portion of a semiconductor wafer is shown comprised of an n type substrate 40 with a layer 41 of n type semiconductor material thereon. As is common in the art, the wafer is typically relatively large and may be intended to include many thousand of devices, including one or more of the invented type. A p type layer 42 is then diffused into layer 44. The layer 42 will eventually become the base of transistors 10 and 11 and is typically 15 microns thick but may be greater or less depending on the requirements of the particular circuit. Next, using conventional masking and doping techniques, areas 43 and 44 of n type semiconductor material are formed in the layer 42 by diffusion. Other areas than those shown, which are associated with other devices on the chip, may be formed at the same time in accordance with normal semiconductor fabrication technology. If the layer 42 were 15 microns thick, as is typical, the areas 43 and 44 would advantageously be 8 to 9 microns deep.

Figure 4D:
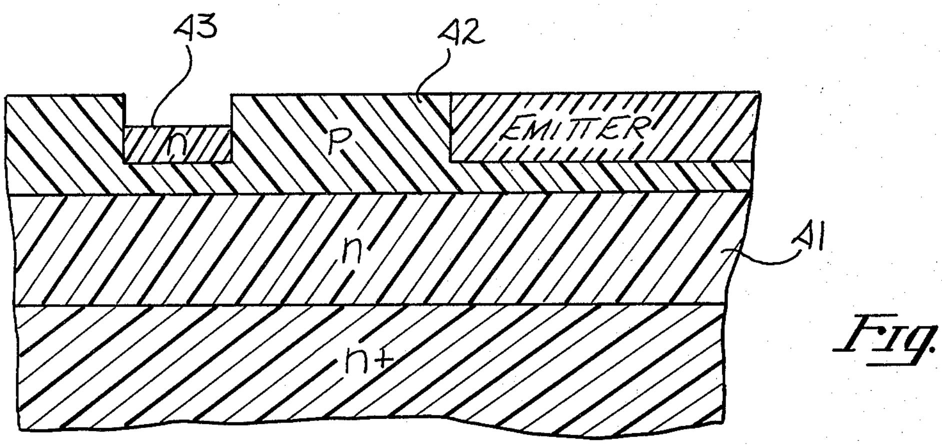

In the completed unit, area 44 will become the emitter 14 of transistor 10 and area 43 the cathode of diode 18. Since these areas were formed simultaneously, the dopings would be expected to be similar. To obtain desirable transistor characteristics, area 44 should be doped such that the carrier concentration at the surface is of the order of $10^{20}$ carriers per cubic centimeter. Such a carrier concentration is undesirable for a diode, however, since it results in a diode having a very low Zener breakdown voltage. A much more desirable doping concentration for diodes is $10^{17}$ or less carriers per cubic centimeter, but this value to too low for an effective emitter. This conflict in requirements is resolved in the invented structure by etching away a portion of area 43 so that a region of lower concentration material is exposed. It has been found that a suitable surface concentration can be obtained, in the case of a structure with the layer thicknesses as previously discussed, by etching away or otherwise removing about 6 microns of material. The etching or removing means are well known in the art and hence are not described in detail. Methods used in this step may include chemical etchants, sputter etching, ion beam machining, thermal halogen etchants, e.g. HCl, Cl2 and other thermal etchants, e.g. SF6 and other methods. A cross section of this region of the chip after etching is shown in FIG. 4*d*.

Once low concentration material is exposed, the diode 18 can be completed in one embodiment of this invention by deposition of metal contact 51 thereon as shown in FIG. 6 forming a Schottky-barrier at the interface with region 43. Insulating layer 52 prevents unwanted current paths between contact 51 and the chip. At its other end, contact 51 makes ohmic connection with region 44, which is the emitter of transistor 10. At the same time that contact 51 is being formed, contact 54, making ohmic connection with both regions 43 and 42 is made thereby establishing the required coupling between the base of the transistor and the cathode of the diode.

An alternative embodiment, illustrated in FIG. 5, is processed as described above for the first embodiment until the stage illustrated in FIG. **4*d* is reached, that is, the step of etching away the high concentration material from the surface of region 43. Instead of then forming a Schottky-barrier on the surface of region 43**, a diffusion of *p* type dopant is made into the region 43 forming region 45. Contact 53 is then deposited making an ohmic connection between regions 45 and 44. The regions 45 and 43 comprise a pn junction which is a monolithic realization of the diode 18 in the circuit of FIG. 1. Contact 53 and insulating layer 52 below it are formed using conventional masking and deposition techniques well known in the art. A contact 54, as in the first embodiment described, is also formed.

What has been described are two embodiments of a realization in integrated circuit form of a circuit which enhances the switching speed of a transistor switch. The examples described were chosen to illustrate the invention and various adaptations and modifications will readily occur to those skilled in the art in light of the present disclosure. Such modifications and adaptations are considered to be within the spirit of the invention as measured by the following claims.

I claim:

1. The method of making a high speed semiconductor switch which comprises the steps of:

a. forming first and second layers of semiconductor material of first and second conductivity type material;
b. diffusing dopant of first conductivity type into two spaced regions of said second layer whereby the first of said regions, said second layer, and said first layer form an emitter, base, and collector respectively of a first transistor;
c. removing a portion of the depth of said second region;
d. forming a semiconductor diode junction at the exposed surface of said second region;
e. conductively coupling said second region in the area away from said junction to said second layer; and
f. conductively coupling the other portion of said diode to said first region.

2. The method of claim 1 where said diode junction is a Schottky barrier junction.

3. The method of claim 2 where the portion of said second region removed is removed by etching the surface of said second region.

4. The method of claim 3 and further including the step of forming a second transistor making a Darlington connection with said first transistor;

5. The method of claim 4 where said first layer is n conductivity material.

6. The method of claim 1 where said diode is formed by diffusing dopant of second conductivity type into a portion of the second of said regions whereby a diode junction is formed between said second region and said portion of said second region doped with second conductivity type dopant.

7. The method fo claim 6 where the portion of said second region removed is removed by etching the surface of said second region.

8. The method of claim 7 and further including the step of forming a second transistor making a Darlington connection with said first transistor.

9. The method of claim 8 where said first layer is n conductivity material.

* * * * *